(12) United States Patent
O'Brien et al.

(10) Patent No.: US 9,312,412 B2
(45) Date of Patent: *Apr. 12, 2016

(54) HIGH EFFICIENCY PHOTOVOLTAIC MODULES

(75) Inventors: Gregory S. O'Brien, Downingtown, PA (US); Ryan R. Dirkx, Glenmore, PA (US)

(73) Assignee: Arkema Inc., King of Prussia, PA (US)

( * ) Notice: Subject to any disclaimer, the term of this patent is extended or adjusted under 35 U.S.C. 154(b) by 400 days.

This patent is subject to a terminal disclaimer.

(21) Appl. No.: 12/918,227

(22) PCT Filed: Feb. 23, 2009

(86) PCT No.: PCT/US2009/034829
§ 371 (c)(1),
(2), (4) Date: Aug. 18, 2010

(87) PCT Pub. No.: WO2009/111194
PCT Pub. Date: Sep. 11, 2009

(65) Prior Publication Data
US 2010/0326517 A1    Dec. 30, 2010

Related U.S. Application Data

(60) Provisional application No. 61/032,661, filed on Feb. 29, 2008.

(51) Int. Cl.
*H01L 31/0236*    (2006.01)
*H01L 31/048*    (2014.01)
(Continued)

(52) U.S. Cl.
CPC .......... *H01L 31/048* (2013.01); *B29C 47/0021* (2013.01); *F24J 2/4652* (2013.01); *F24J 2/506* (2013.01); *H01L 31/0481* (2013.01); *B29C 47/00* (2013.01); *B29C 47/0026* (2013.01); *B29L 2007/008* (2013.01); *B29L 2023/001* (2013.01);
(Continued)

(58) Field of Classification Search
USPC ................................... 136/243, 244, 251, 259
See application file for complete search history.

(56) References Cited

U.S. PATENT DOCUMENTS 4,255,381 A * 3/1981 Eustance et al. .............. 264/519
5,490,893 A    2/1996 Enlow et al.
(Continued)

FOREIGN PATENT DOCUMENTS

JP    11307791 A    4/1980
JP    11-307791    11/1999
(Continued)

OTHER PUBLICATIONS

Hiroshi Kazutomo, and one other, "Novel transparent fluororesin 'Cypto'" Synthetic Resins, Japan Society of Plastics Technology, 1991, vol. 37, No. 7, pp. 46-51 (Partial Translation).

*Primary Examiner* — Jayne Mershon
(74) *Attorney, Agent, or Firm* — Thomas F. Roland

(57) ABSTRACT

The invention relates to high efficiency solar collection devices having a matte surface, a low refractive index surface, or both, that increases solar radiation transmission into the device. The matte surface is on a thermoplastic and may be provided in many ways, such as by a matting agent, by the use of a matte chill roll, embossing, or other techniques. The matte and/or low refractive index surface may be a coating, film (single or multi-layer) or sheet (single or multi-layer). The invention is especially useful in both rigid and flexible photovoltaic modules.

8 Claims, 1 Drawing Sheet

(51) Int. Cl.
  *F24J 2/46*   (2006.01)
  *F24J 2/50*   (2006.01)
  *B29C 47/00*   (2006.01)
  *B29L 7/00*   (2006.01)
  *B29L 23/00*   (2006.01)

(52) U.S. Cl.
  CPC   *Y02E 10/40* (2013.01); *Y02E 10/50* (2013.01); *Y10T 156/10* (2015.01)

(56) References Cited

U.S. PATENT DOCUMENTS

| | | |
|---|---|---|
| 5,783,120 A | 7/1998 | Ouderkirk et al. |
| 5,908,704 A | 6/1999 | Friedman et al. |
| 6,025,069 A | 2/2000 | Eckart et al. |
| 6,748,251 B2 | 6/2004 | Tsenkova et al. |
| 2004/0055211 A1 | 3/2004 | Lestander et al. |
| 2004/0212895 A1 | 10/2004 | Pate |
| 2004/0261836 A1* | 12/2004 | Kataoka et al. ............... 136/244 |
| 2005/0039788 A1 | 2/2005 | Blieske et al. |
| 2006/0068131 A1* | 3/2006 | Hanrahan ................. 428/32.11 |
| 2007/0169805 A1* | 7/2007 | Sasaki et al. .................. 136/256 |
| 2007/0240754 A1 | 10/2007 | Gayout et al. |
| 2008/0149164 A1* | 6/2008 | Goedmakers et al. ........ 136/247 |
| 2008/0210303 A1* | 9/2008 | Lu et al. ....................... 136/260 |
| 2010/0000601 A1 | 1/2010 | Burchill |
| 2012/0276448 A1* | 11/2012 | Yamauchi et al. ............ 429/211 |

FOREIGN PATENT DOCUMENTS

| | | |
|---|---|---|
| JP | 2002203980 A | 12/2000 |
| JP | 2002-286906 | 10/2002 |
| JP | 2005/010572 | 1/2005 |
| WO | WO 2009/067422 | 5/2009 |

* cited by examiner 2 mil Gloss ETFE and 2 mil Matte Kynar 720 Transmission

— 2 mil ETFE
— Kynar 720 Mattte-Gloss (Gloss Side up)
— Kynar 720 Matte-Gloss (Matte Side up)

Kynar Films Transmittance Spectra
Matte Film Surface

Percent Trans: Avg from 400 to 1100 nm
Kynar 3120 - 2 mil matte: 97%
Kynar 2800 - 5 mil matte: 96%
Kynar 720 - 2 mil matte: 97%
ETFE - 2 mil gloss: 92%

— 720 Matte-2 mil    — 2800 Matte - 5 mil
— ETFE 2 mil         — Kynar 3120

HIGH EFFICIENCY PHOTOVOLTAIC MODULES

FIELD OF THE INVENTION

The invention relates to high efficiency solar collection devices having a matte surface, a low refractive index surface, or both, that increases solar radiation transmission into the device. The matte surface is on a thermoplastic and may be provided in many ways, such as by a matting agent, by the use of a matte chill roll, embossing, or other techniques. The matte and/or low refractive index surface may be a coating, film (single or multi-layer) or sheet (single or multi-layer). The invention is especially useful in both rigid and flexible photovoltaic modules.

BACKGROUND OF THE INVENTION

Thermoplastic films and sheets are used in photovoltaic (PV) module glazings as an alternative to glass. Thermoplastics offer advantages of lighter weight, as well as higher light transmittance. The thermoplastic glazing can be used on both flexible and rigid photovoltaic modules. ETFE (ethylene tetrafluoroethylene) is used currently for the manufacture of amorphous silicon cells as an upper glazing material, especially for flexible PV modules. These are sold as gloss-gloss films by commercial suppliers such as DuPont and Saint Gobain.

Polymethylmethacrylate (PMMA) glazing is also being used in PV modules. Weatherability and dirt-shedding of PMMA glazing can be improved by adding a thin polyvinylidene fluoride (PVDF) film on the outer surface, as described in U.S. 60/835,855. PVDF can also be used as a film for the front glazing of a flexible PV module, as described in U.S. 60/989,501. In all of these cited references, the thermoplastic glazing was used with a flat, gloss outer side.

There is a continued effort in the photovoltaic module industry to improve the efficiency of the module and reduce cost. Efforts have been made to use concentrators to reduce the level of silicon, and to use less quantity and less expensive materials. Different surface patterns have also been used to increase the transmittance of solar energy.

Textured surfaces have been used in photovoltaic glazing. US 2005/0039788 and US 2007/0240754 describe a textured transparent glazing having a plurality of large geometric features, which can improve the light transmission of the panel. Light transmission is increased clue to both the reduction of reflection from the textured surface, and also light reflected back to the environment after entering the glazing is reduced. The glazing having the textured surface is relatively thick—in the range of 0.5 to 10 mm. Measured light transmission was as high as 91.9 percent US 2004/0261836 describes a solar cell having an uneven texture fluoride polymer front surface that is subjected to a discharge treatment, to improve the stain resistance. The fluoropolymer film preferably has an uneven pattern that can be applied by pressing with a cooling roll or sandblasting.

It has now been found that a thermoplastic glazing with an external matte surface transmits more solar radiation than a flat surface, or a glazing having a matte surface on the inside surface. Moreover, the matte surface can be translucent, and still transmit high levels of solar radiation. A thermoplastic glazing with a low refractive index also increases solar transmittance, and especially when in combination with a higher refractive index inner layer.

SUMMARY OF THE INVENTION

The invention relates to a high efficiency solar collection device comprising an external thermoplastic glazing material having an average light transmittance of 93% or more, preferably 94% or more, and even greater than 95% and greater than 96% when measured by a Perkin Elmer Lambda 19 Spectrometer using standard transmittance scan from 250 nm-1800 nm, with an integrating sphere over a range from 400 nm to 1100 nm wavelength.

The invention further relates to a high efficiency solar collection device comprising an external thermoplastic translucent matte glazing material, where the matte surface faces the solar radiation source, having a Haze as determined by ASTM D1003 of greater than 15 percent.

Further, the invention relates to a process for increasing the solar transmittance of a solar collection device comprising the step of forming a matte exterior layer on the exterior of the solar collection device, having the matte surface facing the sun.

DETAILED DESCRIPTION OF THE INVENTION

Figure 1:
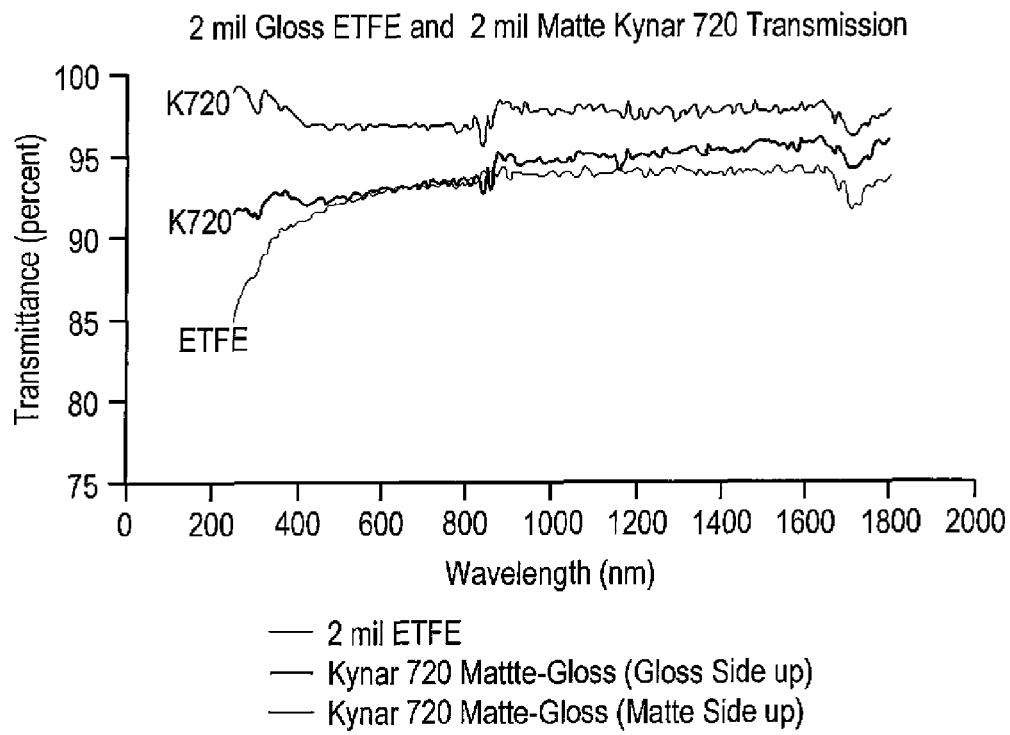
FIGS. 1 and 2 are plots of the percent transmittance over a range of wavelengths for films of different compositions and thicknesses, with an exterior matte surface.

The invention relates to a high efficiency photovoltaic module where the external surface is matte, low refractive index, or both.

As used herein, a "matte surface" means a textured surface that is preferably random in nature. As used herein, "random" as applies to a textured surface means that the cross-section surface profile on the matte side does not have a regular repeating pattern. in nature. The texture results in low reflectivity from the as surface can be measured by the 60-degree gloss measurement. The 60 gloss measured with a BYK-Gardner Micro-TRI-gloss should be less than 15 percent and preferably less than 10% and most preferably less than 5 percent. Surface roughness measurements can also be useful in defining the present invention, however they may not be required. Using a Mahr Federal Pocket Profiliometer with a 4.953 mm (0.195 inch) travel we measured Ra and Rz of example films. Films that met the performance requirements for this invention had an Ra of less than or equal to 0.381 micrometers (15 micro inches). Lower surface roughness might be achieved and still maintaining good performance and low gloss. As used herein, a "translucent" glazing is one having a Haze number as determined by ASTM D1003 of greater than or equal to 15 percent, more preferably greater than or equal to 25% and most preferably greater than or equal to 50 percent.

As used herein the term "film" means a structure comprised of one or more layers, in which the overall thickness is from 5 microns to 375 microns, and preferably from 10 microns to 250 microns.

In a preferred embodiment of the invention, the exterior glazing material of the present invention has a matte surface that is exposed to the solar radiation source.

The external matte surface is formed of a thermoplastic material. Thermoplastics useful in the present invention, include but not limited to alkyl (meth)acrylate polymers and copolymers, ABS terpolymers, ASA copolymers, polycarbonates, polyesters, poly(butylene terephthalate), poly(ethylene terephthalate), MBS copolymers, HIPS, acrylonitrile/acrylate copolymers, acrylonitrile/methyl methacrylate copolymers, impact modified polyolefins and impact modified PVC, fluoropolymers, or mixtures thereof.

In a preferred embodiment, the outer matte surface is a fluoropolymer. Fluoropolymers are known to be tough, chemical resistance, dirt-shedding materials, and high light transmission across a broad spectrum of the light spectrum, and form an excellent protective outer layer. Examples of useful fluoropolymers include, but are not limited to polymers containing at least 50 weight percent of one or more fluoromonomers. The term "fluoromonomer" as used according to the invention means a fluorinated and olefinically unsaturated monomer capable of undergoing free radical polymerization reaction. Suitable exemplary fluoromonomers for use according to the invention include, but are not limited to, vinylidene fluoride, vinyl fluoride, trifluoroethylene, tetrafluoroethylene (TFE), ethylene tetrafluoroethylene, and hexafluoropropylene (HFP) and their respected copolymers. Preferred fluoropolymers are a polyvinylidene fluoride homopolymer or copolymer, and polytetrafluoroethylene homopolymer or copolymers. Fluoro-terpolymers are also contemplated, including terpolymers such as those having tetrafluoroethylene, hexafluoropropene and vinylidene fluoride monomer units.

In another embodiment the outer layer is a blend of polyvinylidene-based polymer and a polymethylmethacrylate-based polymer, which are melt-miscible. The term "based" used herein meaning that the polymer is either a homopolymer, or a copolymer containing at least 50 weight percent, preferably at least 75 weight percent, and more preferably at least 85 weight percent of vinylidene fluoride or methyl methacrylate monomer units. The blend of polyvinylidene-based polymer and a polymethylmethacrylate-based polymer can be at a ratio of from 10-90 to 90-10, and more preferably from 25-75 to 75-25.

The glazing material can be either clear or translucent. Typically solar collection devices use a clear material. Surprisingly it has been found that a matte translucent outer glazing can transmit as much or even more solar radiation into a solar collection device as a clear material.

The exterior matte glazing material can be a single layer, or can be a multi-layer construction. The glazing can be either rigid or flexible. In one embodiment, the glazing is a single thermoplastic sheet having an external matte surface. In another embodiment, the glazing consists of a thermoplastic, thermoset, or even glass onto which a single or multi-layer matte thermoplastic film has been attached. The film can be attached to a clear substrate by means including, but not limited to, lamination, or through the use of an adhesive. Coextrusion of a film or sheet containing two or more layers is also contemplated, with the outer layer having a matte surface due to the presence of a matting agent, by a textured chill roll, by embossing, or by other means. A thin matte film could also be applied in the form of coating containing a matting-agent. The coating could be a in the form of a solution, suspension or emulsion, and can be applied by any coating method including but not limited to, brush, spray, roller, laser jet and other printing techniques.

The glazing of the present invention has a matte surface on the outside surface (surface facing the radiation source). It has been found that glazing having a matte surface only on the outer surface is more effective at transmitting solar radiation than a glazing having a matte surface on the inner surface, or a glazing having a matte texture on both surfaces.

The matte surface can be formed in several ways—generally either by the addition of a matting agent to a polymer matrix, or the post-treatment of a polymer film or sheet. In one embodiment, a matting agent is used to produce the matte surface. Matting agents are known in the art—and often used to produce a no-glare surface on a picture frame or screen. Matting agents include inorganic fillers and polymeric beads. Generally inorganic particles, such as, barium sulfate, calcium carbonate, titanium dioxide, silica, etc. are difficult to disperse evenly in a polymer matrix material and tend to reduce greatly the light transmission of the polymer. Polymeric beads, that are highly cross-linked, are preferably used to produce a matte surface. The beads can be refractive index matched to a polymer matrix material (having a refractive index difference of less than 0.02) or can be slightly refractive index mismatched to the matrix, having a refractive index that is 0.02 or more different than that of the matrix polymer. Preferably the particles are light-diffusing, meaning they scatter or refract the light. The polymeric beads are used at a level of from 5 to 60 weight percent, and preferably 10-30 weight percent, based on the polymer matrix and beads combined. The particles useful in the invention have an average particle size in the range of 1-500 microns, preferably 5-100 microns, more preferably 10-75 microns. One or more different type of diffusing particles may be used. If more than one type and size of diffusing particles are used, at least one needs to have a narrow particle size distribution.

In one embodiment, the particles have a core-shell structure with rubbery alkyl acrylate polymers in the core and at least one polymer shell, which is compatible to the polymer matrix. This outer shell represents only a fraction of the total particle weight. The rubbery core typically comprises an alkyl acrylate polymer having a refractive index that differs by at least 0.02 or more units from that of the matrix polymer.

The matting agent can be incorporated into a thermoplastic matrix during formation of a film or sheet. Matte films can be formed in an extrusion flat film, blown film, a biaxial oriented film, or solution cast or dispersion cast film process. Thin matte films can also be formed by coating a solution, suspension or emulsion coating the matting agent and matrix polymer onto a surface by brushing, laser jet, spray, or other means known in the art.

Surface treatment of a thermoplastic film or sheet can also be used to produce a matte surface. The surface treatment can be a chemical treatment such as etching, or a physical treatment such as embossing. In one embodiment, a thermoplastic film or sheet passes a textured chill roller during the cooling process of an extrusion or co-extrusion. Surfaces could be micro-textured or textured to produce a smoother but still refracting surface to optimize both light transmission and ease of dirt shedding.

While not being bound by any particular theory, it is believed that the surface texturing, while most likely reducing optical clarity surprisingly results in a substantial increase in the total light transmittance, by reducing reflection from the surface—resulting in higher efficiency per square meter for solar cells produced with this as a top glazing material. The texturing must be on the outer surface to optimize the enhancement.

Several preferred embodiments for forming the matte surface for the solar collection device include:

a) forming a thin film (single or multi layer) having a fluoropolymer outer layer. The outer layer is passed beneath a textured chill roller during formation (preferably extrusion or coextrusion) to produce a matte finish. The film laminated, adhered or is coextruded onto a transparent thermoplastic, thermoset, or glass substrate.

b) an aqueous polyvinylidene fluoride latex is formed, and 10 to 40 weight percent of crosslinked polymethylmethacrylate beads are blended into the latex. The latex is then coated onto a transparent substrate.

c) a flexible multi-layer film having a polyvinylidene-based outer layer is provided a matte surface using a chill roll. The film is then used as the glazing on a flexible photovoltaic module.

d) cross-linked poly(meth)acrylate homopolymer or copolymer beads having a selected average particle size (in the range of form 1 to 100 micron diameter) are blended into polyvinylidene fluoride, and then extruded into a film with a gloss chill roll on one side to produce a film with one matte and one gloss surface.

e) the formulation in example (d) is coextruded with another polymer layer of PVDF or other polymer and extruded via a blown film process or cast film process.

f) a PVDF solvent solution or solvent dispersion is mixed with a mineral or PMMA cross-linked particle matting agent. This solution/dispersion is then coated onto a carrier film via reverse roll coating, gravure coating or bar coating and dried/fused into a polymer film. The film could be released from carrier film, or the carrier film could become part of the glazing.

g) coextrusion of a multi-layer film or sheet in which the outer layer, preferably a fluoropolymer, contains a matting agent.

In another embodiment of the invention, the outer surface is a low refractive index material. A low refractive index material, as used herein, means a thermoplastic or thermoset material with a refractive index of lower than 1.46, preferably below 1.43. Examples of a low refractive index material include most fluoropolymers. In the case of a multi-layer structure having a fluoropolymer outer layer, the lower refractive index fluoropolymer on top of a higher refractive index composition also reduces reflection to improve light transmission. Low refractive index surface materials can be used with and without a matting agent, and in combination with other techniques that increase solar transmission, to further enhance light transmission.

The matte/low refractive index surface solar collection glazing of the present invention produced a solar transmittance of greater than 93 percent, even greater than 94 percent, greater than 95 percent and even greater than 96 percent, when the transmittance is averaged over the range of 400 to 1100 nm. This percent transmittance is measured using a Perkin Elmer Lambda 19 Spectrometer using standard transmittance scan from 250 nm-1800 nm, auto-zeroed with white calibration standard (ID US25-99-010) before use. This unit uses an integration sphere to measure total transmittance—rather than linear transmittance.

The matte surface and low refractive index glazings are highly efficient in the transmission of solar radiation, making it particularly useful as the glazing in solar collection devices. While not being bound by any particular theory, it is believed that an advantage of the matte surface of the invention is the increased ability to capture solar radiation at oblique incident angles to the collector. This simulates the movement of the sun relative to a fixed solar collector panel. One particularly useful application is as the glazing on rigid and flexible photovoltaic modules.

The outer glazing layer may optionally contain low amounts of UV absorber of from 0.01 to about 3 weight percent based on polymer solids. The UV absorber could be an organic UV absorber, or an inorganic UV absorber such as zinc oxide and nano-zinc oxide.

Photovoltaic modules consist of an outer glazing material, solar cells generally encapsulated in a clear packaging for protection, and a backsheet. The solar cells are made of materials known for use in solar collectors, including, but not limited to, silicon, cadmium indium selenide (CIS), cadmium indium gallium selenide (CIGS), quantum dots. The back sheet is exposed to the environment on the backside of the photovoltaic module. The primary function of the back sheet is to provide the low water vapor transmission, UV and oxygen barrier properties and necessary to protect the silicon wafers (photocells) from degradation induced by reaction with water, oxygen or UV radiation.

EXAMPLES

Example 1

A 2 mil polyvinylidene fluoride film (KYNAR 720) having one matte surface and one gloss surface was formed—using a textured chill roll to produce the matte surface. Light transmittance, as measured by the average transmittance over the range of 400 to 1100 nm when measured with the spectrophotometer noted above is 97% compared with a 2 mil ETFE film (gloss/gloss) that has an average transmittance of only 92%. FIG. 1 shows the light transmittance curves for this film for testing the KYNAR 720 film matte side up and matte side down. Table 1 shows the results for comparing KYNAR 720 with a matte side up, KYNAR 720 with a matte side down and ETFE for light transmittance. Only the matte side up shows the high level of light transmittance of this invention. This table also shows the Haze of the film and the 60 Degree Gloss. The KYNAR 720 film is not optically clear as measured by the % Haze and has very low gloss as measured by 60 Degree Gloss.

TABLE 1

| Material: | ETFE | KYNAR 720 Gloss/Matte (gloss up) | KYNAR 720 Matte/Gloss (matte up) |
|---|---|---|---|
| 2 mil Film Avg Trans %: 400 to 1100 nm | 92 | 94 | 97 |
| Haze % (ASTM D1003) | 7 | NA | 84 |
| 60 Degree Gloss % | 48 | NA | 1 |

Example 2

Figure 2:
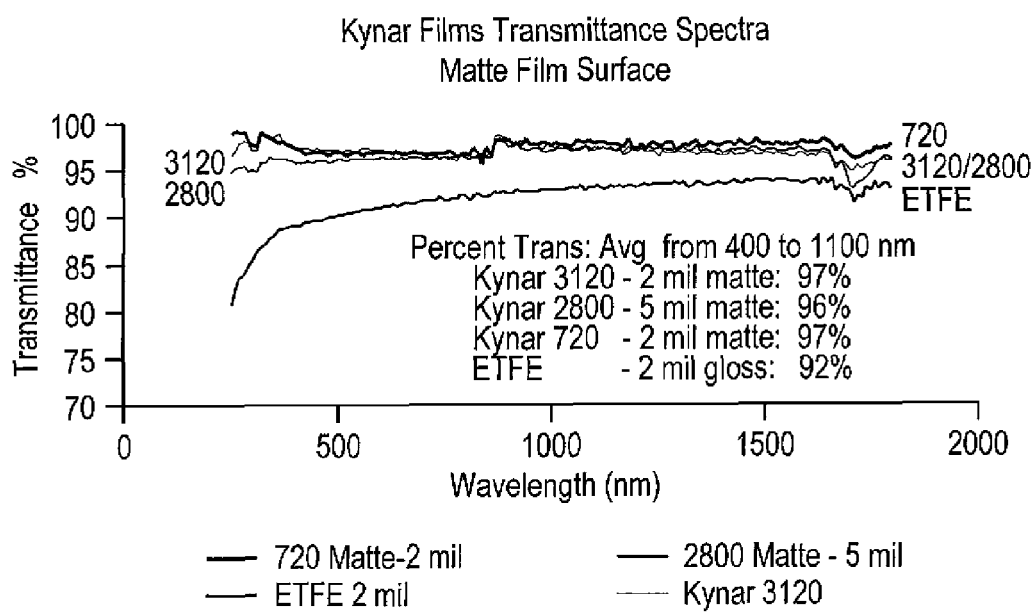

Additional PVDF films were produced using the same technique noted in example 1. Films were produced using KYNAR resin grades that are copolymers with HFP. Both homogeneous copolymers (KYNAR 2800) and heterogeneous copolymers (KYNAR 3120) were used. In the case of the KYNAR 2800 a thicker (5 mil) film was formed and tested. Transmittance data were collected over a range of wavelengths, the result shown in FIG. 1 and FIG. 2, using a Perkin Elmer Lambda 19 Spectrometer using standard transmittance scan from 250 nm-1800 nm, auto-zeroed with white calibration standard (ID US25-99-010) before use. This unit uses an integration sphere to measure total transmittance—rather than linear transmittance. The results in FIG. 2 show that this invention is not dramatically effected by composition as both copolymers had an average light transmittance greater than or equal to 96%. Furthermore, the results are not strongly dependent upon thickness, as the 5 mil KYNAR 2800 had an average light transmittance of 96% while the 2 mil KYNAR 3120 film had an average light transmittance of 97% when the matte side was up. Therefore the invention in not limited to the fluoropolymer or PVDF composition or type or copolymer.

What is claimed is:

1. A high efficiency solar collection device comprising an external, translucent fluoropolymer-based thermoplastic glazing material having an average light transmittance of 95% or more when measured by a Perkin Elmer Lambda 19 Spectrometer using standard transmittance scan from 250 nm-1800 nm, with an integrating sphere over a range from 400 nm to 1100 nm wavelength, wherein the external surface of the fluoropolymer thermoplastic glazing has a matte surface, said matte surface having an Ra of less than or equal to 0.381 micrometers, wherein said fluoropolymer is a polyvinylidene fluoride-based homopolymer or copolymer, and wherein said translucent fluoropolymer-based thermoplastic glazing has a haze as determined by ASTM D1003 of greater than 50 percent.

2. The solar collection device of claim 1 comprising a photovoltaic module.

3. The solar collection device of claim 1, wherein the surface of said glazing material has a matte surface facing a solar radiation source.

4. The solar collection device of claim 1, wherein the surface layer of said glazing comprises a low refractive index material, having a refractive index of 1.46 or less.

5. The solar collection device of claim 1, wherein said average light transmission is greater than or equal to 96 percent.

6. The high efficiency solar collection device of claim 1, wherein said solar collection device comprises a photovoltaic module.

7. The high efficiency solar collection device of claim 1, wherein said external, translucent fluoropolymer-based thermoplastic glazing material is not discharge treated.

8. The high efficiency solar collection device of claim 1, wherein the final treatment of the outer surface of the front glazing material consists of passing said thermoplastic, translucent glazing through a textured chill roller during the cooling process.

* * * * *